(12) United States Patent
Liu et al.

(10) Patent No.: US 8,890,320 B2
(45) Date of Patent: Nov. 18, 2014

(54) VIA ARRANGEMENT AND SEMICONDUCTOR DEVICE WITH THE VIA ARRANGEMENT

(71) Applicants: Semiconductor Manufacturing International Corporation, Shanghai (CN); Semiconductor Manufacturing International Corporation, Beijing (CN)

(72) Inventors: Jerry Liu, Shanghai (CN); Wanchun Ding, Shanghai (CN); Wendy Wei, Shanghai (CN)

(73) Assignees: Semiconductor Manufacturing International (Shanghai) Corporation (CN); Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/659,829

(22) Filed: Oct. 24, 2012

(65) Prior Publication Data

US 2013/0168872 A1    Jul. 4, 2013

(30) Foreign Application Priority Data

Dec. 31, 2011    (CN) .......................... 2011 1 0458672

(51) Int. Cl.
*H01L 23/52*     (2006.01)
*H01L 23/48*     (2006.01)
*H01L 23/538*   (2006.01)

(52) U.S. Cl.
CPC .......... *H01L 23/5384* (2013.01); *H01L 23/481* (2013.01)
USPC ........................................................ 257/773

(58) Field of Classification Search
USPC .................. 257/737, 738, 773, 777, 778, 786
See application file for complete search history.

(56) References Cited

U.S. PATENT DOCUMENTS

| | | | | |
|---|---|---|---|---|
| 7,078,812 B2 * | 7/2006 | Frank et al. | .................... | 257/758 |
| 7,598,621 B2 * | 10/2009 | Yashiro | ......................... | 257/786 |
| 7,786,597 B2 * | 8/2010 | Horiuchi et al. | .............. | 257/778 |
| 8,441,131 B2 * | 5/2013 | Ryan | ............................. | 257/774 |
| 2001/0040297 A1 * | 11/2001 | Yoon et al. | ..................... | 257/774 |

FOREIGN PATENT DOCUMENTS

| | | |
|---|---|---|
| CN | 101483149 A | 7/2009 |
| CN | 200910060750 A | 7/2009 |

* cited by examiner

*Primary Examiner* — Fernando L Toledo
*Assistant Examiner* — Bryan Junge
(74) *Attorney, Agent, or Firm* — Innovation Counsel LLP

(57) ABSTRACT

A semiconductor device may include a first line of vias including a first via and a second via immediately adjacent to the first via. The semiconductor device may further include a second line of vias arranged immediately adjacent to and parallel to the first line of vias, the second line of vias including a third via immediately adjacent to the first via and the second via, the second line of vias further including a fourth via immediately adjacent to the third via, the first via, and the second via. The shortest distance between the second via and the fourth via may be greater than the shortest distance between the first via and the second via.

19 Claims, 5 Drawing Sheets

VIA ARRANGEMENT AND SEMICONDUCTOR DEVICE WITH THE VIA ARRANGEMENT

CROSS-REFERENCE TO RELATED APPLICATIONS

This application claims priority to and benefits of Chinese Patent Application No. 201110458372.5, filed on Dec. 31, 2011 and entitled "ENHANCED ARRAY ARRANGEMENT OF THROUGH VIA AND SEMICONDUCTOR DEVICE WITH THE SAME", which is incorporated herein by reference in its entirety.

BACKGROUND OF THE INVENTION

1. Field of the Invention

The present invention generally relates to semiconductor manufacturing. Particularly, the present invention relates to a semiconductor device with an enhanced arrangement of vertical interconnect accesses (vias). More particularly, the present invention relates to a via arrangement with offset and a semiconductor device having the via arrangement.

2. Description of the Related Art

Vias and related applications are well known in the field of semiconductor devices. For example, vias are commonly used to electronically connect different layers in semiconductor wafers. In the semiconductor field, it is usually necessary to implement high-density via connections in limited areas. For instance, high-density via connections may be typically required given that chips on a semiconductor wafer are usually coupled to pads. When it is necessary to connect a chip to other elements located on different layers of the wafer, pads have to be connected to different layers of the wafer. Because pads have limited areas, it is often required to arrange a large amount of vias in limited areas to improve the conductivity performance.

FIG. 1 illustrates a via arrangement in the prior art. In the prior art, vias are regularly arranged with a certain relation to the crystal orientation of the wafer. As illustrated in FIG. 1, the wafer has the [001] orientation, while the vias are arranged in the [110] orientation. For the convenience of description, the above arrangement is illustrated in a coordinate system having a horizontal axis x and a vertical axis y. It should be understood that the center of any via (or any point on a via) can be used as the origin of the coordinate system.

Vias in FIG. 1 are arranged in a matrix having rows parallel to or aligned with the x axis and having columns parallel to or aligned with the y axis. As illustrated in FIG. 1, there is a first spacing d1 between two adjacent rows, and there is a second spacing d2 between two adjacent columns. The first spacing may be different from the second spacing.

For illustration, three columns of vias A, B, and C are illustrated in FIG. 1, wherein vias in each column are numbered with 1, 2, and 3 for distinguishing the vias from each other. Vias having the same number (e.g., A1, B1, and C1) are considered as corresponding vias in different columns and are in a same row of the matrix. Vias having the same alphabetic character (e.g., A1, A2, and A3) are considered as corresponding vias in different rows and are in a same column of the matrix. Although a 3×3 via array is illustrated in FIG. 1, the 3×3 via array is merely an example for illustration, and those skilled in the art may employ arrays having other numbers of vias.

In some applications, it may be desired to arrange vias with a process that allows a minimal distance d, so that as many vias as possible can be arranged in a limited area. For example, a minimal distance d may exist between the via A2 and each of the vias A1, A3, B2, and C2, and d1=d2=d. FIG. 2 illustrates a schematic cross-sectional view of a structure of a via. In FIG. 2, a via in a silicon wafer 200 comprises a dielectric layer 201, a barrier/glue layer 202, and a filled metal 203. A problem of existing vias is that various materials, such as dielectrics, metals, etc., have to be filled in wafers in order to manufacture vias. Due to the different material characteristics between filled materials and the wafer material (such as Si), accumulated stress exists in the wafer 200. The stress is increasingly accumulated and may cause a crack x as shown in the proximity of the via A3 in FIG. 1. The crack x may cause device failure, such as short circuit, break, etc. The presence of the crack x must be considered in the design of the device, which may limit minimal spacing between various vias, leading to a restricted number of vias arranged in a limited area. Alternatively, a larger area is needed to arrange the vias to reserve a sufficient margin for possible cracks; the arrangement with an increased area may lower conductivity performance and/or may increase cost.

SUMMARY OF THE INVENTION

An embodiment of the invention is related to a semiconductor device that may include a first line (e.g., column or row) of vias including a first via and a second via immediately adjacent to (or immediately neighboring) the first via. The semiconductor device may further include a second line of vias arranged immediately adjacent to and parallel to the first line of vias, the second line of vias including a third via immediately adjacent to the first via and the second via, the second line of vias further including a fourth via immediately adjacent to the third via, the first via, and the second via. The shortest distance between the second via and the fourth via may be greater than the shortest distance between the first via and the third via.

In this specification, that a via is immediately adjacent to or immediately neighboring another via means that no other via is disposed between the two immediately adjacent vias, for example, in a plan view of the semiconductor device. In addition, that a line of vias is immediately adjacent to or immediately neighboring another lien of vias means that no other line of vias is disposed between the two immediately adjacent lines of vias, for example, in a plan view of the semiconductor device. The shortest distance between a first via and a second via is the distance between the point of the first via that is the closest to the second via and the point of the second via that is the closest to the first via.

In one or more embodiments, the shortest distance between the second via and the fourth via may be greater than the shortest distance between the first via and the second via.

In one or more embodiments, the shortest distance between the third via and the fourth via may be less than the shortest distance between the first via and the second via.

In one or more embodiments, the shortest distance between the first via and the third via may be different from the shortest distance between the first via and the second via.

In one or more embodiments, an imaginary line connecting a center point of the second via and a center point of the fourth via may be at a first acute angle with respect to an edge of the semiconductor device.

In one or more embodiments, the first acute angle may be greater than or equal to 10° and may be less than or equal to 45°.

In one or more embodiments, the first acute angle may be greater than or equal to 30° and may be less than or equal to 45°.

In one or more embodiments, an imaginary line connecting a center point of the first via and a center point of the third via may be at a second acute angle with respect to the edge of the semiconductor device.

In one or more embodiments, the second acute angle may be equal to the first acute angle in size.

In one or more embodiments, the second acute angle may be different from the first acute angle in size.

In one or more embodiments, the first line of vias may be arranged parallel to an edge of the semiconductor device.

In one or more embodiments, the first line of vias may be arranged at an acute angle with respect to an edge of the semiconductor device. In one or more embodiments, the acute angle is less than 45°.

An embodiment of the invention is related to semiconductor device that may include a first line of vias including a first via and a second via immediately adjacent to the first via. The semiconductor device that may further include a second line of vias arranged immediately adjacent to and parallel to the first line of vias, the second line of vias including a third via immediately adjacent to the first via and the second via, the second line of vias further including a fourth via immediately adjacent to the third via, the first via, and the second via. The shortest distance between the second via and the fourth via is greater than the shortest distance between the first via and the second via.

An embodiment of the invention is related to a semiconductor device that may include a first line of vias arranged at a first acute angle less than 45° with respect to an edge of the semiconductor device, the first line of vias including a first via and a second via immediately adjacent to the first via. The semiconductor device that may further include a second line of vias arranged immediately adjacent to and parallel to the first line of vias, the second line of vias including a third via immediately adjacent to the first via and the second via, the second line of vias further including a fourth via immediately adjacent to the third via, the first via, and the second via.

In one or more embodiments, an imaginary line connecting a center point of the first via and a center point of the third via may be at a second acute angle with respect to the edge of the semiconductor device.

In one or more embodiments, an imaginary line connecting a center point of the second via and a center point of the fourth via may be at a third acute angle with respect to the edge of the semiconductor device.

In one or more embodiments, the semiconductor device may further include a third line of vias arranged immediately adjacent to and parallel to the second line of vias, the third line of vias including a fifth via immediately adjacent to the third via and the fourth via, the third line of vias further including a sixth via immediately adjacent to the fifth via, the third via, and the fourth via, the third line of vias further including a seventh via immediately adjacent to the fifth via, the third via, and the fourth via. None of the fifth via, the sixth via, and the seventh via is aligned with a straight line of vias that includes the second via and the fourth via.

In one or more embodiments, none of the fifth via, the sixth via, and the seventh via is aligned with a straight line of vias that includes the first via and the third via.

In one or more embodiments, the shortest distance between the second via and the fourth via may be greater than the shortest distance between the first via and the second via.

In one or more embodiments, the shortest distance between the second via and the fourth via may be greater than the shortest distance between the first via and the third via.

In one or more embodiments, the shortest distance between the third via and the fourth via may be less than the shortest distance between the first via and the second via.

In one or more embodiments, the shortest distance between the first via and the third via may be different from the shortest distance between the first via and the second via.

An embodiment of the invention is related to a semiconductor device having an enhanced via arrangement. In the via arrangement, a via array may be arranged according to a second crystal orientation in a Si wafer having a first crystal orientation. The via array may be arranged in an array (a reference array) having a first direction as its row direction and a second direction as its column direction. The arrangement of at least a portion of the via array may be different from the reference array, so that at least a distance between vias in this portion is larger than a reference distance between their reference positions in the reference array, while the area of the via array is kept substantially unchanged with respect to the reference array.

In one or more embodiments, in the via array, there is a first spacing between adjacent rows and a second spacing between adjacent columns.

In one or more embodiments, vias in the portion are arranged such that an angle formed between an imaginary line connecting corresponding vias in two adjacent columns and the first direction is larger than 10° and is less than or equal to 45°.

In one or more embodiments, the angle is larger than or equal to 30° and is less than or equal to 45°.

In one or more embodiments, the vias are arranged such that the angle is different for different vias of a column.

In one or more embodiments, the vias in the portion are arranged such that spacing between two adjacent columns is less than the second spacing through reducing at least a distance between corresponding vias of two adjacent columns to a reference distance of the vias (based on the reference array).

In one or more embodiments, the vias in the portion are arranged such that an angle formed between an imaginary line connecting corresponding vias in two adjacent rows and the second direction is larger than 10° and is less than or equal to 45°.

In one or more embodiments, the angle is larger than or equal to 30° and is less than or equal to 45°.

In one or more embodiments, the vias are arranged such that the angle is different for different vias of a row.

In one or more embodiments, the vias in the portion are arranged such that spacing between two adjacent rows is less than the first spacing through reducing at least a distance between corresponding vias of two adjacent rows to a reference distance of the vias (based on the reference array).

In one or more embodiments, the vias are formed in a dielectric layer on the substrate, a barrier layer is deposited on the inner side of the vias, and a metal is filled in the vias.

In one or more embodiments, the vias are arranged such that an angle formed between an imaginary line connecting each via in one of two adjacent rows and a corresponding via in the other row, and the second direction is larger than 0° and is less than or equal to 45°.

In one or more embodiments, the first crystal orientation is the (001) crystal orientation, and the second crystal orientation is the (110) crystal orientation.

In one or more embodiments, the angle is 45°.

In one or more embodiments, a distance between adjacent rows in the portion is less than the first spacing, and a distance between adjacent columns in the portion is less than the second spacing, through decreasing increased distance between the vias to a reference distance (based on the reference array).

In one or more embodiments, the first spacing is equal to the second spacing.

The above and other aspects of this invention will become more apparent from the following description.

Although a description will be given with a wafer having the (001) crystal orientation hereinafter, it should be understood that the present invention is applicable to various common wafers. For example, this invention is applicable to wafers having at least one of the (110) and (100) crystal orientations.

Embodiments of the invention may be related to one or more via arrangements in semiconductor devices and/or may be related to one or more semiconductor devices with one or more enhanced via arrangements. Embodiments of the invention may substantially and/or selectively reduce stress in one or more semiconductor devices. Embodiments of the invention may enable semiconductor devices to have desirable stress distribution and/or may represent semiconductor devices having desirable stress distribution. Advantageously, embodiments of the invention may enable substantially satisfactory performance, reliability, and/or durability of a semiconductor device. Alternatively or additionally, embodiments of the invention may represent semiconductor devices with substantially satisfactory performance, reliability, and/or durability.

BRIEF DESCRIPTION OF THE DRAWINGS

Preferred embodiments of this invention will be described herein with reference to accompanying drawings, in which the same reference labels may be used to represent the same elements.

DETAILED DESCRIPTION

Embodiments of this invention will be described herein with reference to accompanying drawings, in which the same reference labels may be used to represent the same elements.

For facilitating discussion, examples in the description will be given with reference to a wafer having a (001) crystal surface though the invention may be applicable to wafers having one or more other crystal orientations.

Figure 3A:
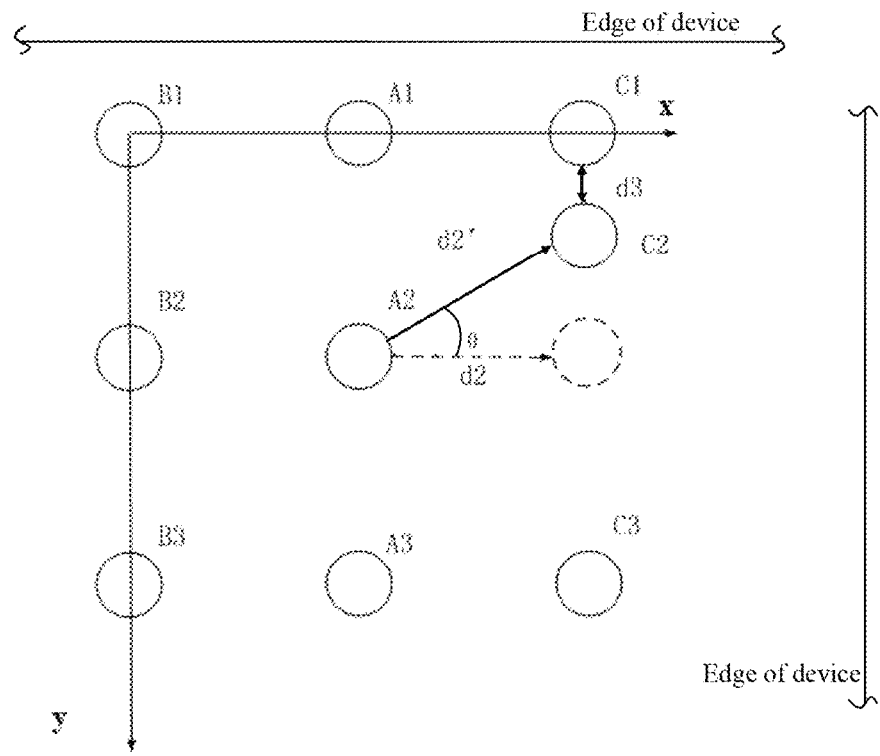
FIGS. 3A and 3B illustrate one or more via arrangements in plan views of one or more semiconductor devices according to one or more embodiments of this invention.
Figure 3B:
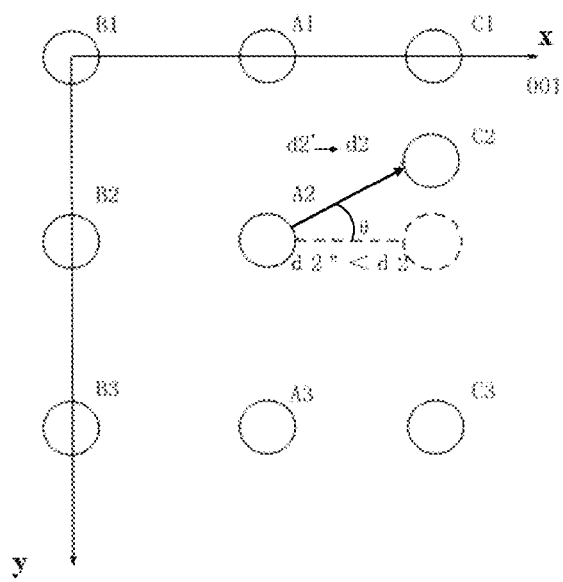

FIG. 3A and FIG. 3B illustrate one or more via arrangements in plan views of one or more semiconductor devices according to one or more embodiments of this invention. A via (vertical interconnect access) in one or more embodiments of the invention may be one of a through via, a blind via, a buried via, etc.

Referring to FIG. 3A, a via arrangement as shown comprises three columns of vias parallel to or aligned with the y axis, wherein at least a portion of the matrix is changed to increase spacing between adjacent vias. As shown in the figure, for example, a via C2 is deviated from a row that includes vias A2 and B2. The dashed circle in the figure represents a reference position in the row that includes vias A2 and B2.

In the description, a "line connecting two vias" may refer to an imaginary straight line connecting the centers of the two vias. A "line connecting two vias" may also refer to a straight line connecting corresponding points of two vias, for example, points located at corresponding positions on the circumferences of the two vias.

In one or more embodiments, a line connecting corresponding vias A2 and C2 in the A and C columns forms an acute angle $\theta$ with respect to the row direction (x axis). When keeping the spacing between A and C columns unchanged as $d2$, the distance $d2'$ between the vias A2 and C2 is greater than $d2$ given that the position of C2 deviates from the row including vias A2 and B2, according to the relationship of the hypotenuse and the right-angle sides of a right-angled triangle. Thus, it can be seen that when the via C2 is deviated from the row that includes its corresponding vias A2 and B2, the distance between the vias A2 and C2 is increased. Because the distance between A2 and C2 becomes larger than $d2$, stress induced between A2 and C2 will decrease. Therefore, the possibility of incurring cracks between A2 and C2 is reduced. Even if some cracks occur between A2 and C2, the possibility of fault of the whole semiconductor device caused by cracks is lowered since the distance between A2 and C2 is increased. Besides, because the distance between the columns that include A2 and C2 is still kept to $d2$, stress between adjacent vias is decreased with no substantial change in the dimension of the whole via array.

Note that a process-related minimal spacing d between C2 and its adjacent via (e.g., C1) should be ensured. For instance, it should be ensured that $d3>d$. In one or more embodiments, the angle $\theta$ is larger than or equal to 10° and is less than or equal to 45°. In one or more embodiments, the angle $\theta$ is larger than or equal to 30° and is less than or equal to 45°. In one or more embodiments, $\theta$ is equal to 45°.

As described above, it is possible to make a via deviated from a reference position (located in a row that includes corresponding vias of the via) by changing the via arrangement of at least a portion of an array, so that spacing between adjacent vias in that portion can be increased. Such a change may improve expected conductivity performance in, for example, applications where the conductivity performance of one or several vias among multiple vias is more importance than the conductivity performance of other vias. According to one or more embodiments of the invention, the conductivity performance and durability of those important vias can be improved.

In one or more embodiments of this invention, a plurality of vias or all vias in a column can be shifted toward a specific direction to deviate from their corresponding reference positions (in rows that include their corresponding vias) by a predetermined angle or a predetermined distance. For example, all three vias in the B column can be shifted along the y axis to form a specific angle $\theta$ between a line connecting each pair of corresponding vias in the columns A and B and the x axis. In one or more embodiments, the angle $\theta$ larger than 10° and is less than or equal to 45°. In one or more embodiments, the angle θ is larger than or equal to 30° and is less than or equal to 45°. In one or more embodiments of this invention, the angles associated with different via pairs may be different from each other. For example, the line connecting B1 and A1 may be at an angle θ1 with respect to the x axis, and the line connecting B2 and A2 may be at an angle θ2 with respect to the x axis, wherein the angle θ1 may be larger than the angle θ2.

Figure 1:
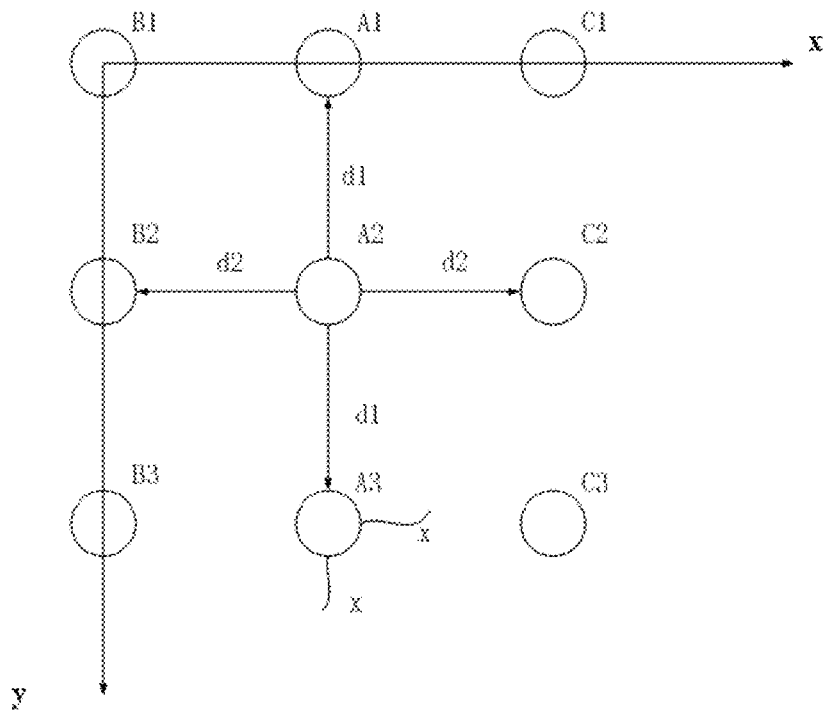
FIG. 1 illustrates a schematic plan view of a via array in the prior art.
Figure 2:
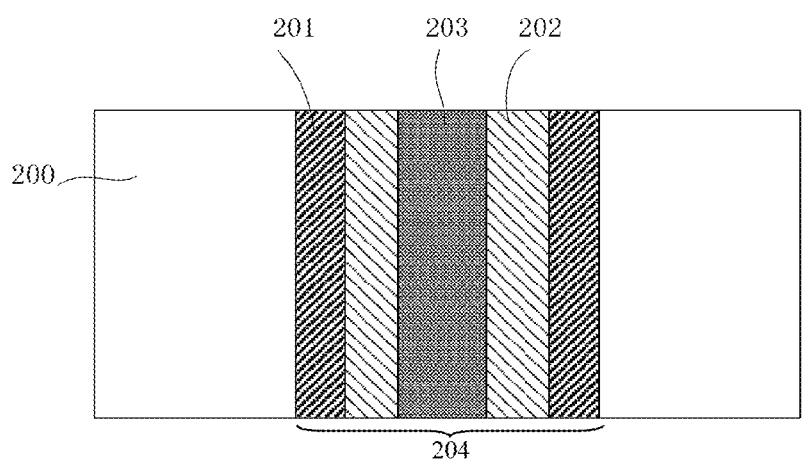
FIG. 2 illustrates a schematic cross-sectional view of the structure of a via in the prior art.

In one or more embodiments, as illustrated in FIG. 3B with reference to FIG. 3A, the dimension of the via array can be reduced while keeping stress magnitude substantially unchanged. Referring to FIGS. 3A and 3B, one can appreciate that the column C in FIG. 3B is disposed closer to the column A in FIG. 3B in comparison with the example of FIG. 3A. In one or more embodiments, the distance between corresponding vias A2 and C2 in the example of FIG. 3B can be reduced from the reference distance d2' illustrated in the example of FIG. 3A to the reference column spacing d2 illustrated in the example of FIG. 3A. At the same time, the distance d2' between the columns A and C in the example of FIG. 3B is less than the reference column spacing d2 illustrated in the example of FIG. 3A. Accordingly, the dimension of the whole via array can be reduced with the decrease of the distance between the columns A and C. In addition, the dimension of the whole via array can be reduced while keeping the stress level unchanged in comparison with the prior art example illustrated in FIG. 1 given that d2'=d2. Advantageously, the increasing demand for further reduced dimensions of semiconductor devices may be satisfied.

Although C2 is shown to be deviated from its reference position in the negative y direction in FIGS. 3A and 3B, those skilled in the art may understand that C2 can be deviated from its reference position in the positive y direction. In one or more embodiments of this invention, vias in one column of every two columns are kept at their reference positions while one or more vias in the other column are located at one or more positions that deviate from one or more reference positions.

Embodiments of the invention have been described with a wafer having the (001) crystal orientation as examples. Nonetheless, embodiments of this invention may be applicable to wafers having one or more of other crystal orientations, which for simplicity may not be described in detail herein.

In one or more embodiments, the stress level between specific vias can be reduced while the dimension of the via array is kept substantially unchanged. In one or more embodiments, the whole dimension of the via array can be reduced changing the arrangement of at least a portion of the via array while the stress level between corresponding vias is kept unchanged.

Figure 4:
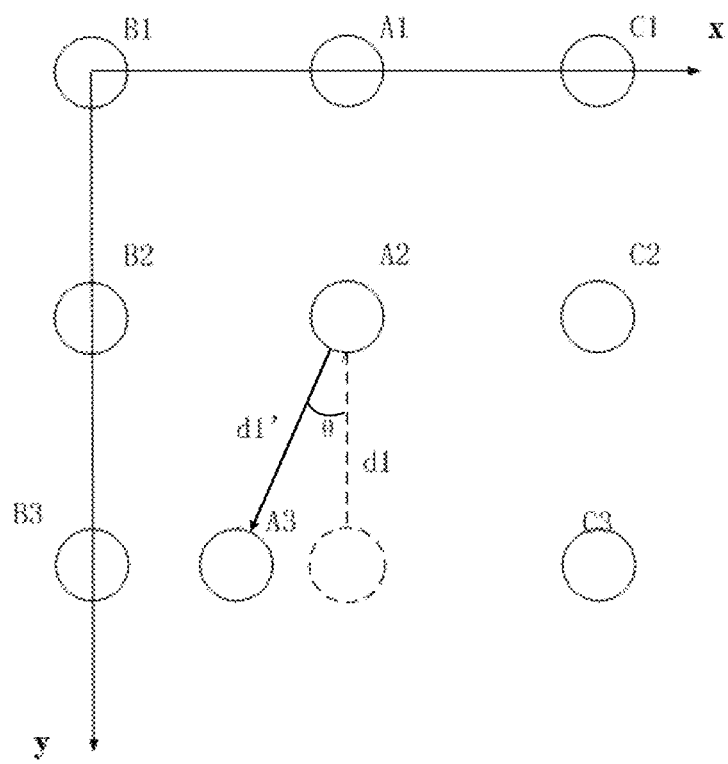
FIG. 4 illustrates a via arrangement in a plan view of a semiconductor device according to one or more embodiments of this invention.

FIG. 4 illustrates a via arrangement in a plan view of a semiconductor device according to one or more embodiments of this invention.

In one or more embodiments, the via A3 can be deviated from its reference position (represented by the dashed line) located in the column that includes its corresponding vias A1 and A2. In one or more embodiments, a line connecting corresponding vias A2 and A3 in rows 2 and 3 forms an acute angle θ with the column direction (y axis). In one or more embodiments, if the distance of two adjacent rows is kept unchanged (substantially unchanged area of the via array), it can be seen that the distance between the vias A2 and A3 is increased, leading to reduced stress accordingly.

Analogous to the example of FIG. 3B, in one or more embodiments, the distance between the row 2 (including the vias B2, A2, and C2) and the row 3 (including the vias B3, A3, and C3) also can be reduced to make the distance d1' between A2 and A3 equal to the reference row distance d1. Accordingly, the distance between the row 2 and the row 3 will be less than the reference distance d1. Thus, a downsized array can be obtained while keeping stress level unchanged. In one or more embodiments, the formed angle θ may have ranges analogous to the ranges of the angle θ discussed with reference to at least one of FIG. 3A and FIG. 3B.

In one or more embodiments of this invention, a plurality of vias in a row can be deviated from their reference positions by one or more specific angles towards one or more specific directions. In one or more embodiments of this invention, one row of every two rows is kept unchanged while vias of the other row may be deviated from their respective reference positions.

Figure 5:
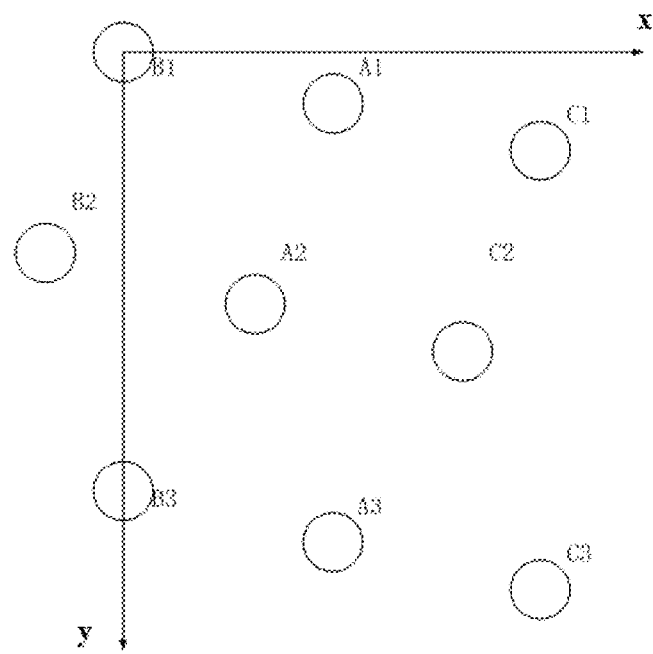
FIG. 5 illustrates a via arrangement in a plan view of a semiconductor device according to one or more embodiments of this invention.

FIG. 5 illustrates a via arrangement in a plan view of a semiconductor device according to one or more embodiments of this invention.

As illustrated in FIG. 5, one or more of the row 1 (including the vias B1, A1, and C1), the row 2 (including the vias B2, A2, and C2), and the row 3 (including the vias B3, A3, and C3) may be disposed at one or more acute angles with respect to the x axis, wherein the x axis may be parallel to a first edge of the device that includes the vias. In one or more embodiments, the rows 1, 2, and 3 may be disposed at the same acute angle (e.g., smaller than 45°) with respect to the x axis. In one or more embodiments, an imaginary line connecting centers of the vias B1 and B3 may be parallel to or aligned with the y axis, wherein the y axis may be parallel to a second edge of the device that includes the vias and may be perpendicular to the x axis. In addition, at least one of an imaginary line connecting the centers of the vias B1 and B2 and an imaginary line connecting the centers of the vias B2 and B3 may be at an acute angle (e.g., smaller than 45°) with respect to the y axis. In one or more embodiments, the vias can be arranged in a random manner such that a via spacing in a portion of the array is larger than a via spacing in another portion of the array and such that the outer dimensions of the device that includes the vias may be kept substantially the same as the outer dimensions of a device that includes the vias illustrated in FIG. 1.

Although vias may be deviated from their reference positions, distances between adjacent vias should be larger than or equal to a process allowed minimal distance. Those skilled in the art may understand that the "process allowed minimal distance" mentioned herein may vary according to various implementations or applications (for example, vias of different materials, different types of wafers, etc.).

In one or more embodiments of this invention, the vias may be implemented in a silicon (Si) wafer. In one or more embodiments, the vias may be implemented in one or more wafers of one or more other semiconductor materials, for example, germanium.

Those skilled in the art may understand that although a 3*3 via array is shown in various embodiments above, the technical solution of this invention is intended to encompass via arrays with arbitrary dimensions.

Figure 6:
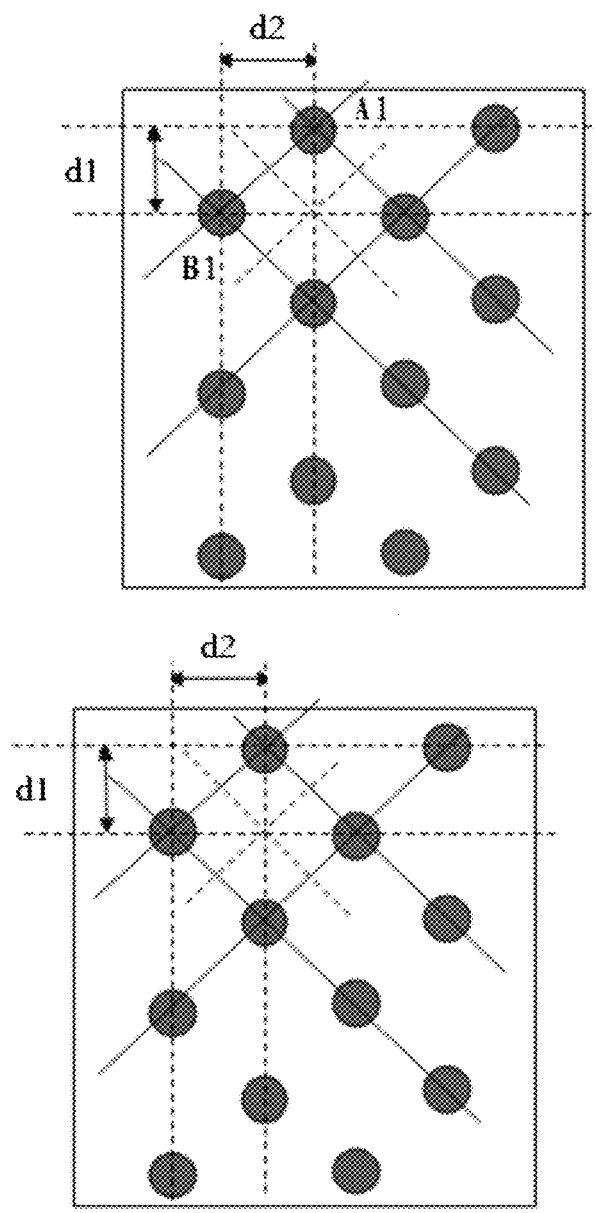
FIG. 6 illustrates a via arrangement in a plan view of a semiconductor device according to one or more embodiments of this invention.

FIG. 6 illustrates a via arrangement in a plan view of a semiconductor device according to one or more embodiments of this invention. As illustrated in FIG. 6, one column of two adjacent columns is kept unchanged while vias the other one deviate from their reference positions illustrated in FIG. 1. In one or more embodiments, the vias have a depth of 30 μm and a diameter of 13 μm; the thickness of the barrier layer of each via of the vias is 0.06 μm; the dielectric layer of each via of the vias is made of $SiO_2$ and is 0.2 μm thick; d1=d2=27 μm; the angle formed between the line connecting illustrative vias B1 and A1 and the x axis is 45°. The distance between B1 and A1 is increased to 38.178 μm with reference to d1=d2=27 μm.

The arrangement shown in FIG. 6 can be considered as employing a via arrangement of the (100) crystal orientation in a (001) wafer. Wherein, the angle between a line connecting corresponding vias in two adjacent columns and the x axis is 45°. In addition, it can be considered as increasing the via spacing shown in FIG. 1 by about 1.414 times with the 45° offset arrangement.

Figure 7:
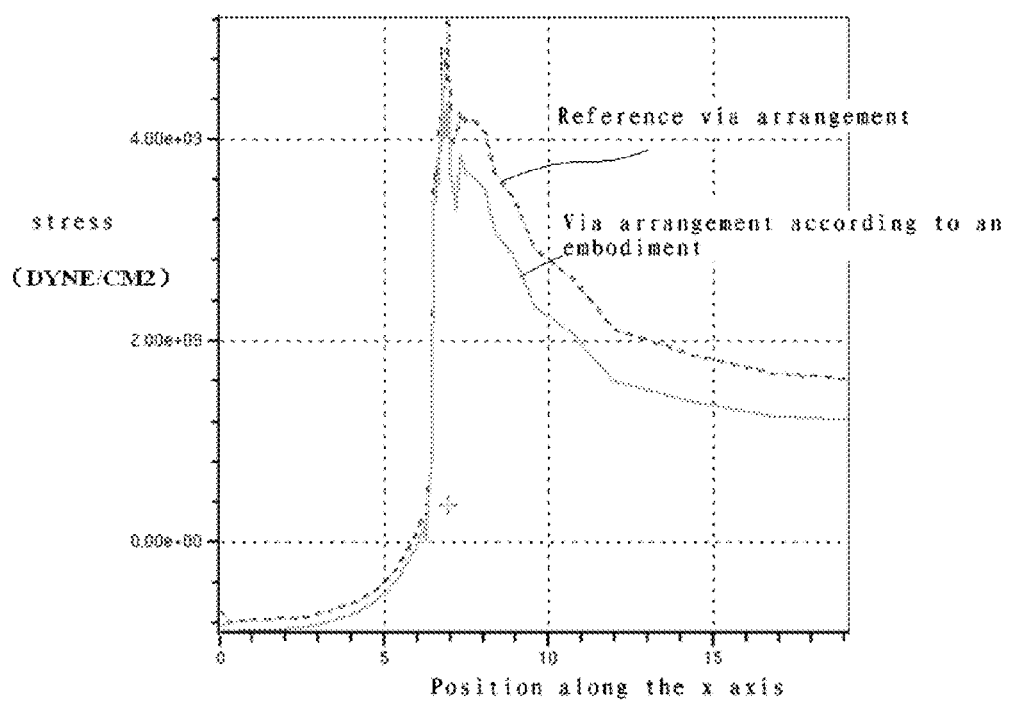
FIG. 7 illustrates simulation results related to the via arrangement of FIG. 6 and the via arrangement of FIG. 1.

FIG. 7 illustrates simulation results related to the via arrangement of FIG. 6 and the via arrangement of FIG. 1. It can be seen that for vias with a radius of 6.5 μm (at the position of x=6.5 μm on the horizontal axis), there is an apparently larger stress present in the reference via arrangement illustrated in FIG. 1. In contrast, in the via arrangement according to an embodiment of this invention illustrated in FIG. 6, the stress is notably reduced. Therefore, a semiconductor device with improved and/or satisfactory reliability can be provided.

It should be understood that one or more terms representing positional relations, such as one or more of "up", "down", "left", "right", "horizontal", "longitudinal", and "vertical", may be used herein to represent the positional relation of one element, layer, or region with respect to another element, layer, or region. It should be understood that these terms are intended to cover orientations other than those shown in the figures.

Unless otherwise mentioned, terms used herein (including technical and scientific terms) have the same meanings as those commonly understood by those skilled in the art. Further, it should be understood that terms used herein should be explained as having meanings consistent with their meanings in the context of this specification and relative fields, which unless otherwise specified herein should not be explained in an idealized or over-formalized sense.

The above embodiments are only illustrative for the convenience of description. The scope claimed by this invention should be in accordance with the scope of the applied patent and is not limited to the above embodiments.

What is claimed is:

1. A semiconductor device comprising:
a first line of vias including a first via and a second via immediately adjacent to the first via;
a second line of vias arranged immediately adjacent to and parallel to the first line of vias, the second line of vias including a third via immediately adjacent to the first via and the second via, the second line of vias further including a fourth via immediately adjacent to the third via, the first via, and the second via; and
a third line of arranged immediately adjacent to and parallel to the second line of vias, the third line of vias including a fifth via immediately adjacent to the third via and the fourth via, the third line of vias further including a sixth via immediately adjacent to the fifth via, the third via, and the fourth via,
wherein the shortest distance between the second via and the fourth via is greater than the shortest distance between the first via and the third via,
wherein an imaginary line connecting centers of the first via and the fifth via is positioned between the third via and the fourth via and is not perpendicular to an imaginary line connecting centers of the first line of vias,
wherein the third via is position between the imaginary line connecting the centers of the first via and the fifth via and an imaginary line connecting centers of the second via and the sixth via, and
wherein an imaginary line connecting centers of the second via and the third via is at an obtuse angle with respect to an imaginary line connecting centers of the third via and the fifth via.

2. The semiconductor device of claim 1, wherein the shortest distance between the second via and the fourth via is greater than the shortest distance between the first via and the second via.

3. The semiconductor device of claim 1, wherein the shortest distance between the third via and the fourth via is less than the shortest distance between the first via and the second via.

4. The semiconductor device of claim 1, wherein the shortest distance between the first via and the third via is different from the shortest distance between the first via and the second via.

5. The semiconductor device of claim 1, wherein an imaginary line connecting a center point of the second via and a center point of the fourth via is at a first acute angle with respect to an edge of the semiconductor device.

6. The semiconductor device of claim 5, wherein the first acute angle is greater than or equal to 10° and is less than or equal to 45°.

7. The semiconductor device of claim 5, wherein the first acute angle is greater than or equal to 30° and is less than or equal to 45°.

8. The semiconductor device of claim 5, an imaginary line connecting a center point of the first via and a center point of the third via is at a second acute angle with respect to the edge of the semiconductor device.

9. The semiconductor device of claim 8, wherein the second acute angle is equal to the first acute angle in size.

10. The semiconductor device of claim 8, wherein the second acute angle is different from the first acute angle in size.

11. The semiconductor device of claim 8, wherein the first line of vias is arranged at a third acute angle with respect to the edge of the semiconductor device.

12. The semiconductor device of claim 1, wherein the first line of vias is arranged at an acute angle with respect to an edge of the semiconductor device.

13. The semiconductor device of claim 12, wherein the acute angle is less than 45°.

14. A semiconductor device comprising:
a first line of vias including a first via and a second via immediately adjacent to the first via;
a second line of vias arranged immediately adjacent to and parallel to the first line of vias, the second line of vias including a third via immediately adjacent to the first via and the second via, the second line of vias further including a fourth via immediately adjacent to the third via, the first via, and the second via; and
a third line of vias arranged immediately adjacent to and parallel to the second line of vias, the third line of vias including a fifth via immediately adjacent to the third via and the fourth via, the third line of vias further including a sixth via immediately adjacent to the fifth via, the third via, and the fourth via, the third line of vias further including a seventh via immediately adjacent to the fifth via, the third via, and the fourth via,
wherein none of the fifth via, the sixth via, and the seventh via is aligned with a straight line of vias that includes the second via and the fourth via,
wherein the shortest distance between the second via and the fourth via is greater than the shortest distance between the first via and the second via, and wherein an imaginary line connecting centers of the second via and the third via is at an obtuse angle with respect to an imaginary line connecting centers of the third via and the fifth via.

15. A semiconductor device comprising:

a first line of vias arranged at a first acute angle with respect to an edge of the semiconductor device, the first line of vias including a first via and a second via immediately adjacent to the first via;

a second line of vias arranged immediately adjacent to and parallel to the first line of vias, the second line of vias including a third via immediately adjacent to the first via and the second via, the second line of vias further including a fourth via immediately adjacent to the third via, the first via, and the second via, wherein the shortest distance between the second via and the fourth via is greater than the shortest distance between the first via and the second via; and a third line of vias arranged immediately adjacent to and parallel to the second line of vias, the third line of vias including a fifth via immediately adjacent to the third via and the fourth via, the third line of vias further including a sixth via immediately adjacent to the fifth via, the third via, and the fourth via, the third line of vias further including a seventh via immediately adjacent to the fifth via, the third via, and the fourth via, wherein none of the fifth via, the sixth via, and the seventh via is aligned with a straight line of vias that includes the second via and the fourth via, and wherein none of the fifth via, the sixth via, and the seventh via is aligned with a straight line of vias that includes the first via and the third via.

16. The semiconductor device of claim 15, wherein an imaginary line connecting a center point of the first via and a center point of the third via is at a second acute angle with respect to the edge of the semiconductor device.

17. The semiconductor device of claim 16, wherein an imaginary line connecting a center point of the second via and a center point of the fourth via is at a third acute angle with respect to the edge of the semiconductor device.

18. The semiconductor device of claim 15, wherein the first acute angle is less than 45°.

19. The semiconductor device of claim 15, wherein an imaginary line connecting centers of the second via and the third via is at an obtuse angle with respect to an imaginary line connecting centers of the third via and the fifth via.

* * * * *